(12) United States Patent
Kang et al.

(10) Patent No.: US 8,232,985 B2
(45) Date of Patent: Jul. 31, 2012

(54) DISPLAY DRIVING CIRCUIT INCLUDING A LATCH-UP PREVENTION UNIT

(75) Inventors: Tae Kyoung Kang, Chungbuk (KR); Jun Hyoung Myoung, Seoul (KR); Jin Wook Kim, Chungbuk (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 749 days.

(21) Appl. No.: 12/165,652

(22) Filed: Jun. 30, 2008

(65) Prior Publication Data

US 2009/0021505 A1   Jan. 22, 2009

(30) Foreign Application Priority Data

Jun. 29, 2007   (KR) .................. 10-2007-0065343

(51) Int. Cl.
*G09G 5/00* (2006.01)
*G06F 3/038* (2006.01)

(52) U.S. Cl. ......................... 345/212; 345/95
(58) Field of Classification Search .................. 345/212, 345/87, 95, 98, 100
See application file for complete search history.

(56) References Cited

U.S. PATENT DOCUMENTS

| 6,898,096 | B2 | 5/2005 | Endo et al. |
| 7,110,274 | B1 | 9/2006 | Endo et al. |
| 7,167,141 | B2 | 1/2007 | Goto et al. |
| 2002/0145599 | A1 | 10/2002 | Endo et al. |
| 2003/0067429 | A1* | 4/2003 | Aoki et al. ................. 345/87 |
| 2003/0184538 | A1* | 10/2003 | Yamato et al. ............. 345/211 |
| 2004/0021616 | A1 | 2/2004 | Goto et al. |
| 2005/0062520 | A1* | 3/2005 | Kim et al. ................. 327/536 |
| 2005/0122297 | A1* | 6/2005 | Imagawa et al. .......... 345/89 |
| 2007/0109215 | A1 | 5/2007 | Goto et al. |
| 2007/0205801 | A1* | 9/2007 | Perisetty ................. 326/26 |
| 2008/0094386 | A1* | 4/2008 | Park et al. ................. 345/212 |

FOREIGN PATENT DOCUMENTS

| JP | 2002-313925 | 10/2002 |
| JP | 2004-004630 | 1/2004 |
| JP | 2004-061892 | 2/2004 |
| KR | 10-2002-0080239 A | 10/2002 |

OTHER PUBLICATIONS

Japanese Office Action issued on Apr. 19, 2011, in corresponding Japanese Application No. 2008-169274 (3 pages).

* cited by examiner

*Primary Examiner* — Chanh Nguyen
*Assistant Examiner* — Robert Stone
(74) *Attorney, Agent, or Firm* — NSIP Law

(57) ABSTRACT

A display driving circuit is provided. The display driving circuit includes first to third voltage generation units configured to receive an externally applied input voltage having a same magnitude and generate respective voltages having different magnitudes, and a latch-up prevention unit connected to the second voltage generation unit and configured to receive a lower voltage among voltages output from the second voltage generation unit and to ground the lower voltage for a preset period of time.

19 Claims, 5 Drawing Sheets

DISPLAY DRIVING CIRCUIT INCLUDING A LATCH-UP PREVENTION UNIT

CROSS-REFERENCE TO RELATED APPLICATION

The benefit of priority is claimed to Republic of Korea patent application no. 10-2007-0065343, filed Jun. 29, 2007, which is incorporated by reference herein in its entirety.

BACKGROUND

1. Field of the Invention

The following description relates, in general, to a display driving circuit that may serve to prevent latch-up, and, more particularly, to a display driving circuit, in which a second driving voltage output from a second voltage generation unit is connected to a latch-up prevention unit having a plurality of switching means and is grounded for a preset period of time, thus being a display driving circuit that may serve to prevent an occurrence of latch-up.

2. Description of the Related Art

Generally, a Liquid Crystal Display (LCD) is an electric device for converting various types of electrical information, generated by various devices, into visual information using variation in the transmissivity of liquid crystal depending on an applied voltage, and for transmitting the visual information. An LCD is a kind of flat panel display, which requires a backlight due to its lack of self-luminescence, but has low power consumption and is easily used for portable devices, and thus the frequency of use of LCDs has increased.

A driving device for driving such an LCD includes a plurality of voltage generation units for generating a driving voltage required to drive an LCD panel and a plurality of voltages required to drive the peripheral devices of the LCD panel, and is configured to display electrical information as visual information by supplying respective generated voltages as time passes.

Hereinafter, a conventional display driving circuit will be described below with reference to related drawings.

FIG. 1 is a block diagram showing a conventional display driving circuit, FIGS. 2B and 2B are a circuit diagram and a sectional view showing the transistor of the first voltage generation unit of FIG. 1, FIG. 3 is a block diagram showing the second voltage generation unit of FIG. 1, and FIG. 4 is a circuit diagram showing the second voltage generation unit of FIG. 3.

As shown in FIG. 1, the conventional display driving circuit includes first to third voltage generation units 110, 120 and 130 for generating different voltages, respectively.

In this case, the first voltage generation unit 110 is connected both to a display panel (not shown) and to the second voltage generation unit 120, and is configured to receive an externally applied input voltage VCI, to output a first source voltage VCH, required to operate the display panel, and to supply the first source voltage VCH to the display panel.

The second voltage generation unit 120 is connected to the display panel and the first and third voltage generation units 110 and 130, and is configured to receive the input voltage VCI and to output first and second driving voltages VGH and VGL, required to turn on/off respective cells of the display panel, thus enabling the display panel to be turned on/off.

Further, the third voltage generation unit 130 is connected both to the display panel and to the second voltage generation unit 120, and is configured to receive the input voltage VCI, output a second source voltage VCL, required to operate the display panel, and supply the second source voltage VCL to the display panel.

In particular, the second voltage generation unit 120 must generate the second driving voltage VGL after the first and second source voltages VCH and VCL have been generated by the first voltage generation unit 110 and the second voltage generation unit 130, respectively.

At this time, as shown in FIG. 2, which shows a transistor M1 among the devices constituting the first voltage generation unit 110, the transistor M1 must always transmit a voltage having a predetermined magnitude in order to charge a capacitor C1 connected to the transistor M1. However, since excessive current is generated at the time of initially applying the input voltage VCI, there is a problem in that latch-up occurs.

That is, as shown in FIG. 2B, which shows the section of the transistor M1, the transistor M1 is configured such that, when the first source voltage VCH in a steady state is higher than the input voltage VCI, current flows along the path (1). However, when the input voltage VCI is initially applied, the first source voltage VCH, which is the voltage output from the transistor M1, is initialized to 0V by a capacitor C1 having 0V as an initial value, and thus excessive current is generated and flows into the transistor M1 along a path (2).

An N-type well is filled with holes along the path (2) shown in the transistor M1 due to the excessive current generated when the input voltage VCI is initially applied, and the holes flow into the lower portion of a substrate along a path (3), and thus the voltage of the lower portion of the substrate increases.

In this case, the lower portion of the substrate is a place at which the second driving voltage VGL is generated by the second voltage generation unit 120, and the increase in the voltage of the lower portion of the substrate is equal to the increase in the second driving voltage VGL. In particular, the first and second source voltages VCH and VCL and the first and second driving voltages VGH and VGL, which are output from the display driving circuit, must be sequentially output. However, there is a problem in that, when the voltage of the lower portion of the substrate increases along the path (3), as described above, the second driving voltage VGL has a predetermined magnitude before it is output, and thus latch-up occurs.

Further, as shown in FIG. 3, the second voltage generation unit 120 includes a logic signal generation unit 121, a level shifting unit 122, and a charging unit 123, and is operated such that, after the operation of the charging unit 123 has been completed, a second driving voltage VGL is output.

However, as shown in FIG. 4, which shows the level shifting unit 122, a through current, flowing from the first and second source voltages VCH and VCL and the first driving voltage VGH to the second driving voltage VGL, is generated by the level shifting unit 122 along a path (1). In this case, there is a problem in that the second driving voltage VGL is output early, out of sequence of the generation thereof, due to the through current generated along the path (1), and thus latch-up occurs.

Further, as shown in FIG. 5, which is a block diagram showing another embodiment of a conventional display driving circuit, a circuit for preventing the occurrence of latch-up according to another embodiment is configured such that a Schottky diode 240, for grounding the second driving voltage VGL until the time point at which the second driving voltage VGL is generated is reached, is connected to a second voltage generation unit 220 in the lower portion of a substrate. At this time, the anode of the Schottky diode 240 is connected to the second driving voltage output terminal (not shown) of the second voltage generation unit 220, and the cathode thereof is grounded.

Accordingly, when the second driving voltage VGL is higher than the conduction voltage of the Schottky diode 240 for the reasons shown in FIGS. 2 and 2B and FIGS. 3 and 4, the second driving voltage VGL is grounded, and thus the occurrence of latch-up can be prevented.

However, there is a problem in that, since the Schottky diode 240 is separately manufactured, without being manufactured together with a display driving circuit, at the time of manufacturing the display driving circuit, and is attached to the display driving circuit, the costs increase in proportion to the cost of the materials for the Schottky diode 240.

Further, there is a problem in that, since a space corresponding to the size of the Schottky diode 240 is required in order to attach the Schottky diode to the display driving circuit, the size of the display driving circuit increases in proportion to the size of the Schottky diode 240.

SUMMARY OF THE INVENTION

Accordingly, there is provided a display driving circuit, in which a second driving voltage output from a second voltage generation unit is connected to a latch-up prevention unit having a plurality of switching means connected to the ground, and is grounded for a preset period of time, thus being a display driving circuit that may serve to prevent an occurrence of latch-up and reduce a size of a display driving circuit.

In one general aspect, there is provided a display driving circuit, including first to third voltage generation units configured to receive an externally applied input voltage having a same magnitude and generate respective voltages having different magnitudes, and a latch-up prevention unit connected to the second voltage generation unit and configured to receive a lower voltage among voltages output from the second voltage generation unit and to ground the lower voltage for a preset period of time.

The general aspect of the display driving circuit may further provide that the latch-up prevention unit includes a control logic unit configured to output a control signal, required to control supply of the lower voltage among the voltages output from the second voltage generation unit, a level shifting unit connected to the control logic unit and configured to receive the control signal from the control logic unit and to output a gate voltage corresponding to the control signal; and a switching means, a gate of which is connected to the level shifting unit, a source of which is connected to the second voltage generation unit, and a drain of which is grounded.

The general aspect of the display driving circuit may further provide that the source of the switching means is connected to an output terminal, through which the lower voltage among the voltages output from the second voltage generation unit is output.

The general aspect of the display driving circuit may further provide that the switching means is one selected from among an NMOS transistor and a PMOS transistor.

The general aspect of the display driving circuit may further provide that the latch-up prevention unit includes a control logic unit configured to output a control signal, required to control supply of the lower voltage among voltages output from the second voltage generation unit, a decoding unit connected to the control logic unit and configured to receive both the control signal and a decoding signal preset by a user and to output a plurality of selection signals, a level shifting unit connected both to the control logic unit and to the decoding unit, and configured to receive the control signal from the control logic unit and the plurality of selection signals from the decoding unit and to output a plurality of gate voltages, and a switching unit connected to the level shifting unit and configured to receive the plurality of gate voltages and to ground the lower voltage among the voltages output from the second voltage generation unit.

The general aspect of the display driving circuit may further provide that the switching unit includes a plurality of switching means, gates of which are connected to the level shifting unit, sources of which are connected to the second voltage generation unit, and drains of which are grounded.

The general aspect of the display driving circuit may further provide that the sources of the switching means are connected to an output terminal, through which the lower voltage among the voltages output from the second voltage generation unit is output.

The general aspect of the display driving circuit may further provide that each of the plurality of switching means may be one selected from among an NMOS transistor and a PMOS transistor.

Other features and aspects may be apparent from the following claims and detailed description taken in conjunction with the accompanying drawings, in which:

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Detailed descriptions may be omitted if it is determined that the detailed descriptions of related well-known functions and constructions may make the gist of general aspects unclear.

Hereinafter, an example of a display driving circuit will be described in detail with reference to the attached drawings.

Figure 1:
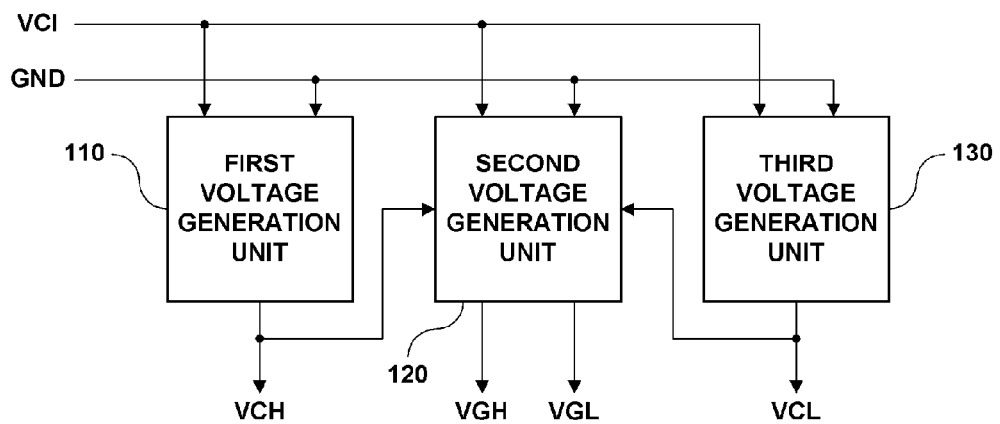
FIG. 1 is a block diagram showing a conventional display driving circuit.
Figure 2:
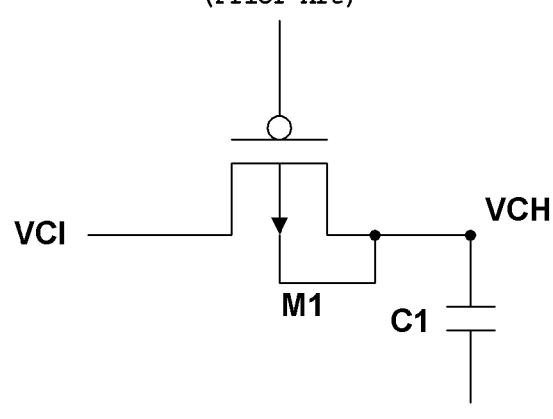
FIGS. 2 and 2B are a circuit diagram and a sectional diagram of the transistor of the first voltage generation unit of FIG. 1.
Figure 2B:
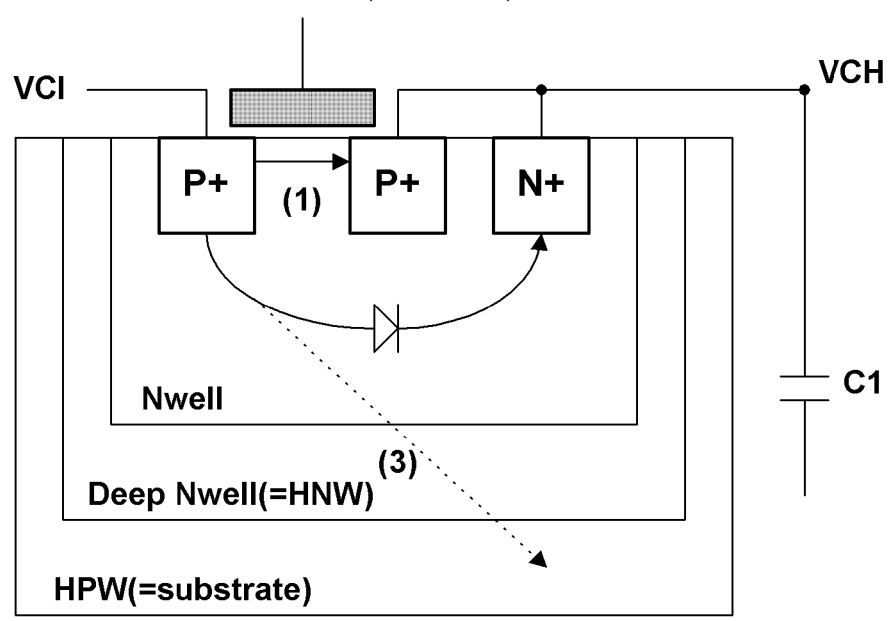
Figure 3:
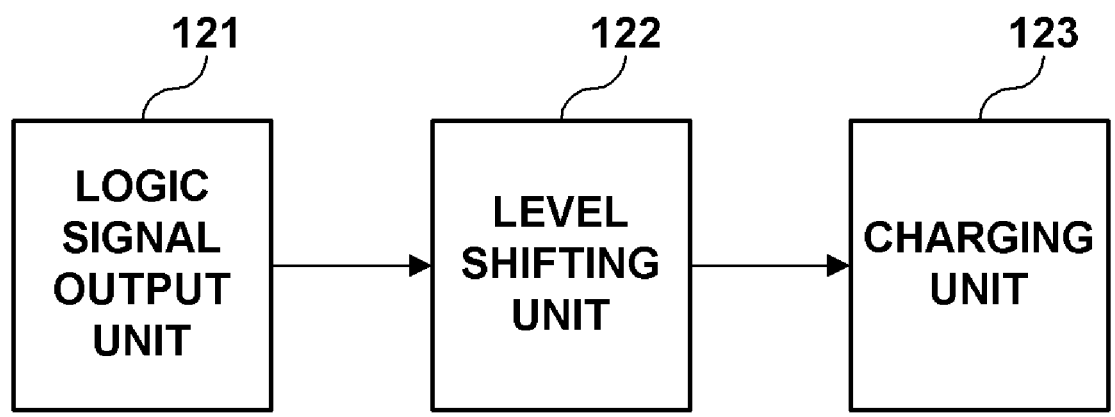
FIG. 3 is a block diagram showing the second voltage generation unit of FIG. 1.
Figure 4:
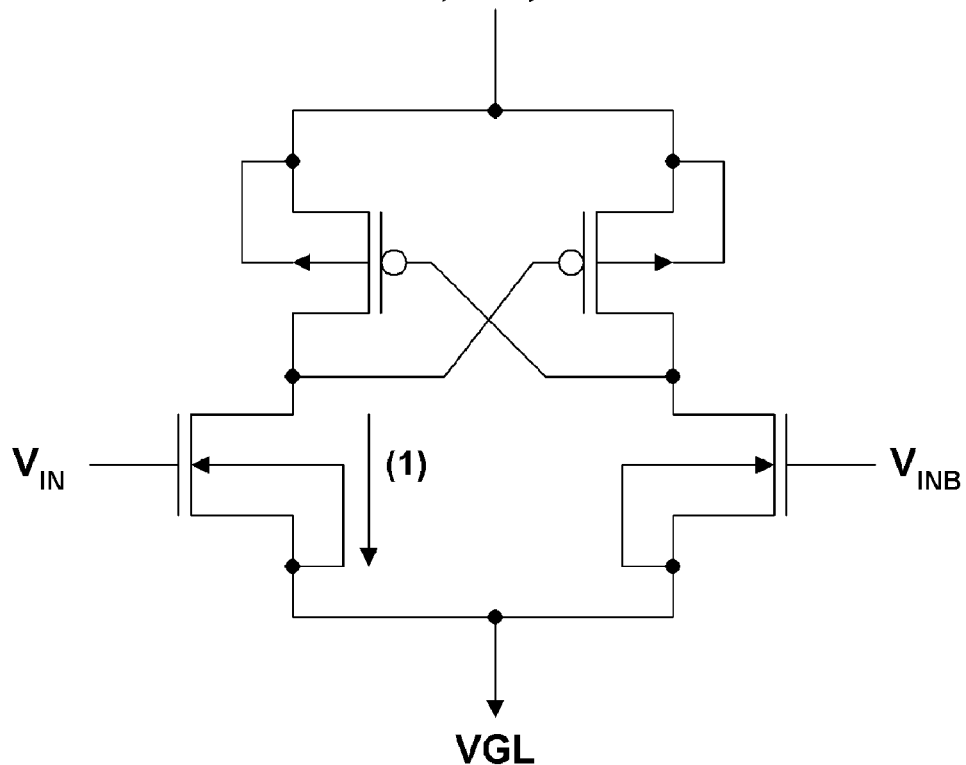
FIG. 4 is a circuit diagram showing the second voltage generation unit of FIG. 3.
Figure 5:
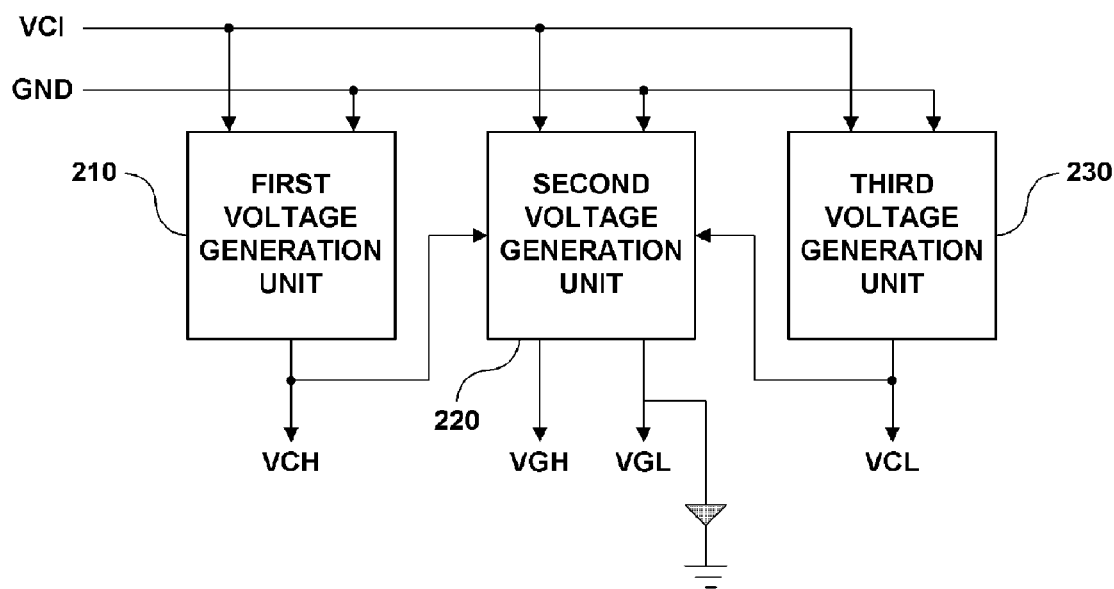
FIG. 5 is a block diagram showing another embodiment of a conventional display driving circuit.
Figure 6:
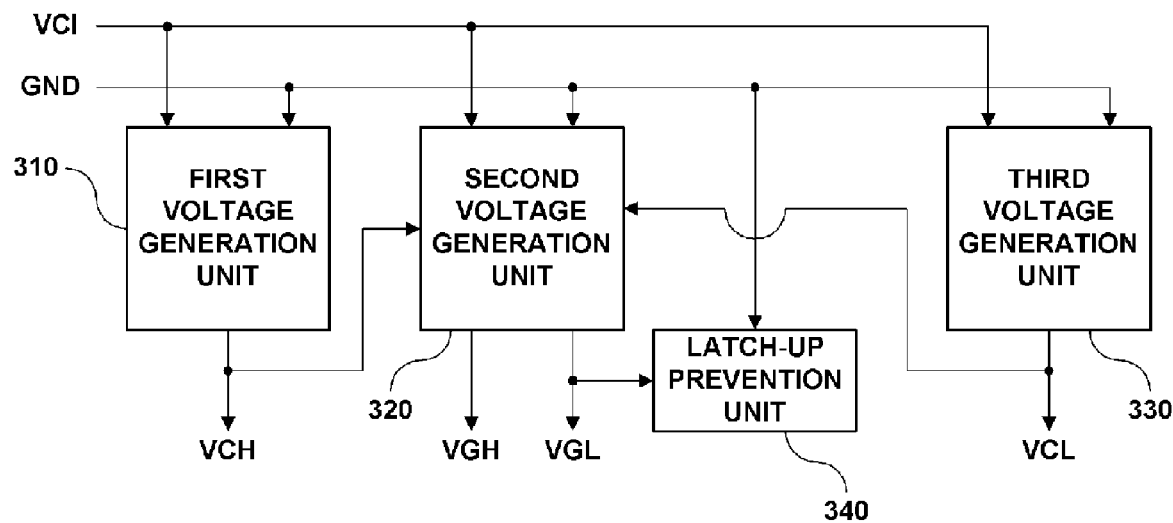
FIG. 6 is a block diagram illustrating an example of a display driving circuit.

FIG. 6 is a block diagram schematically illustrating an example of a display driving circuit.

As shown in FIG. 6, the display driving circuit includes a first voltage generation unit 310, a second voltage generation unit 320, a third voltage generation unit 330, and a latch-un prevention unit 340.

Here, the first voltage generation unit 310 is connected to the second voltage generation unit 320, and is configured to receive an externally applied input voltage VCI, to generate a first source voltage VCH, which is required to operate a display panel (not shown), by converting the input voltage VCI into a predetermined voltage, and to supply the generated first source voltage VCH to the display panel. The first source voltage VCH is the higher of the voltages supplied to the display panel, and is 5.5V.

Further, the second voltage generation unit 320 is connected to the first voltage generation unit 310, the third voltage generation unit 330 and the latch-up prevention unit 340, and is configured to receive the input voltage VCI, to generate first and second driving voltages VGH and VGL by converting the input voltage VCI into certain voltages after the first and second source voltages VCH and VCL have been generated by the first voltage generation unit 310 and the third voltage generation unit 330, and to output the first and second driving voltages VGH and VGL through first and second output terminals N1 and N2 (not shown).

At this time, the first and second driving voltages VGH and VGL, generated by the second voltage generation unit 320, are voltages required to turn on/off respective cells constituting the display panel, and the first driving voltage VGH, which is a high voltage, is 16.5V, and the second driving voltage VGL, which is a low voltage, is −13.5V.

Further, the third voltage generation unit 330 is connected to the second voltage generation unit 320, and is configured to receive the input voltage VCI, to generate a second source voltage VCL, required to operate the display panel, by converting the input voltage VCI into a certain voltage, and to supply the second source voltage VCL to the display panel together with the first source voltage VCH. At this time, the second source voltage VCL is the lower of the voltages supplied to the display panel, together with the first source voltage VCH, and is −2.75V. Accordingly, the display panel is supplied with and operated by the first and second source voltages VCH and VCL, swinging from 5.5V to −2.75V, and thus the display panel converts electrical signals into visual information and displays the visual information.

The latch-up prevention unit 340 is connected to the second output terminal N2 of the second Voltage generation unit 320, through which the second driving voltage VGL is output. The latch-up prevention unit 340 is configured to receive the second driving voltage VGL, output from the second voltage generation unit 320, and to ground the second driving voltage VGL, which is generated before the time point at which the second driving voltage VGL must be generated for a preset period of time. As a result, the latch-up prevention unit 340 may prevent latch-up attributable to the previously generated second driving voltage from occurring.

Hereinafter, first and second embodiments of the latch-up prevention unit 340 will be described in detail with reference to related drawings.

Embodiment 1

Figure 7:
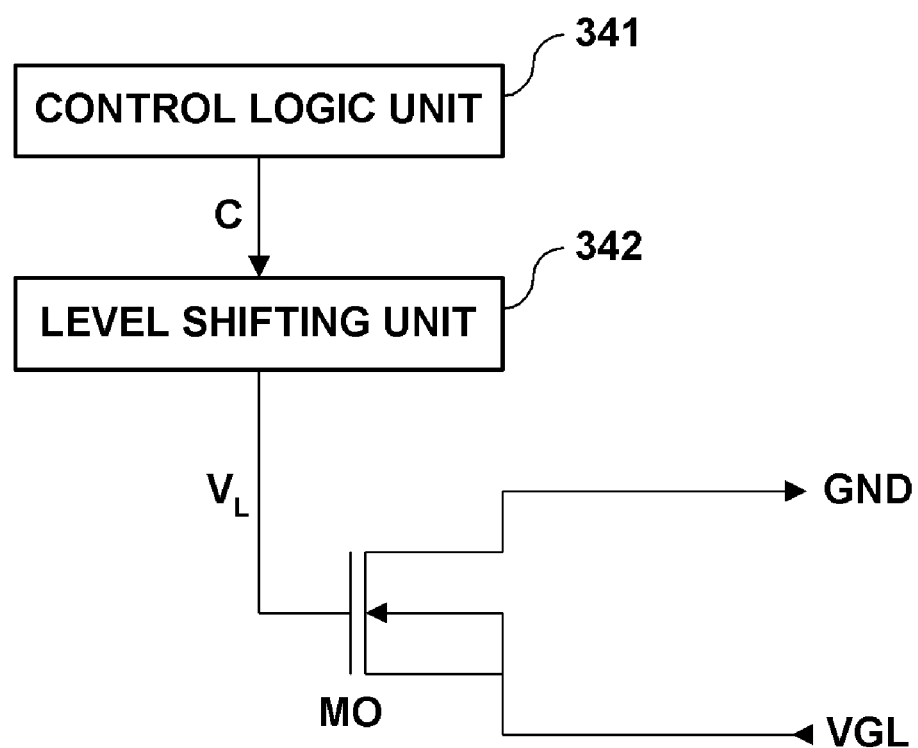
FIG. 7 is a block diagram illustrating an example of a first embodiment of the latch-up prevention unit of the display driving circuit.

FIG. 7 is a block diagram illustrating an example of a first embodiment of the latch-up prevention unit 340 of the display driving circuit.

As shown in FIG. 7, the latch-up prevention unit 340 of the display driving circuit includes a control logic unit 341, a level shifting unit 342 and a switching means M0.

The control logic unit 341 is connected to the level shifting unit 342 and is configured to generate a control signal C, required to control the supply of the second driving voltage VGL, which is the lower of the first and second driving voltages VGH and VGL output from the second voltage generation unit 320 and is required to turn off the display panel, and to output the control signal C.

The level shifting unit 342 is connected both to the control logic unit 341 and to the switching means M0, and is configured to receive the control signal C, output from the control logic unit 341, and to output a gate voltage VL corresponding to the control signal C.

Further, since the latch-up prevention unit 340 can be manufactured on the same substrate at the time of manufacturing the first to third voltage generation units 310, 320 and 330, the size of a circuit may be reduced compared to a driving circuit in which a Schottky diode must be separately manufactured and attached in order to prevent the occurrence of latch-up. A connection between the driving circuit and the display panel through a flexible printed circuit board may be facilitated thanks to a spatial margin, which may result in simplification of manufacturing processes and reduction of the cost of materials, thus improving production efficiency.

In this case, the switching means M0 receives the gate voltage VL, output from the level shifting unit 342, and is turned on/off in response to the gate voltage VL, so that the second driving voltage VGL, which is output from the second output terminal N2 of the second voltage generation unit 320, or which is generated by both the first voltage generation unit 310 and the second voltage generation unit 320, can be grounded.

For example, when the generation of the second driving voltage VGL must be prevented because the generation of the first and second source voltages VCH and VCL is not completed by the first and third voltage generation units 310 and 330, the control logic unit 341 outputs a control signal C, required to ground the second driving voltage VGL generated by the transistor of the first voltage generation unit 310 and the through current of the second voltage generation unit 320.

When the control signal C, required to ground the second driving voltage VGL, is output, the level shifting unit 342 receives the control signal C and outputs a gate voltage VL, required to turn on the switching means M0. At this time, the switching means M0, having received the gate voltage VL, is turned on in response to the gate voltage VL to ground the second driving voltage VGL, so that latch-up occurring due to the second driving voltage VGL can be prevented, and thus damage to the display driving circuit can be prevented.

Further, since the latch-up prevention unit 340 can be manufactured on the same substrate at the time of manufacturing the first to third voltage generation units 310, 320 and 330, there are advantages in that the size of a circuit can be further reduced compared to a conventional driving circuit, in which a Schottky diode must be separately manufactured and attached in order to prevent the occurrence of latch-up, in that a connection between the driving circuit and the display panel through a flexible printed circuit board can be facilitated thanks to a spatial margin, and in that manufacturing processes can be simplified and the cost of materials can be reduced, thus improving production efficiency.

Embodiment 2

Figure 8:
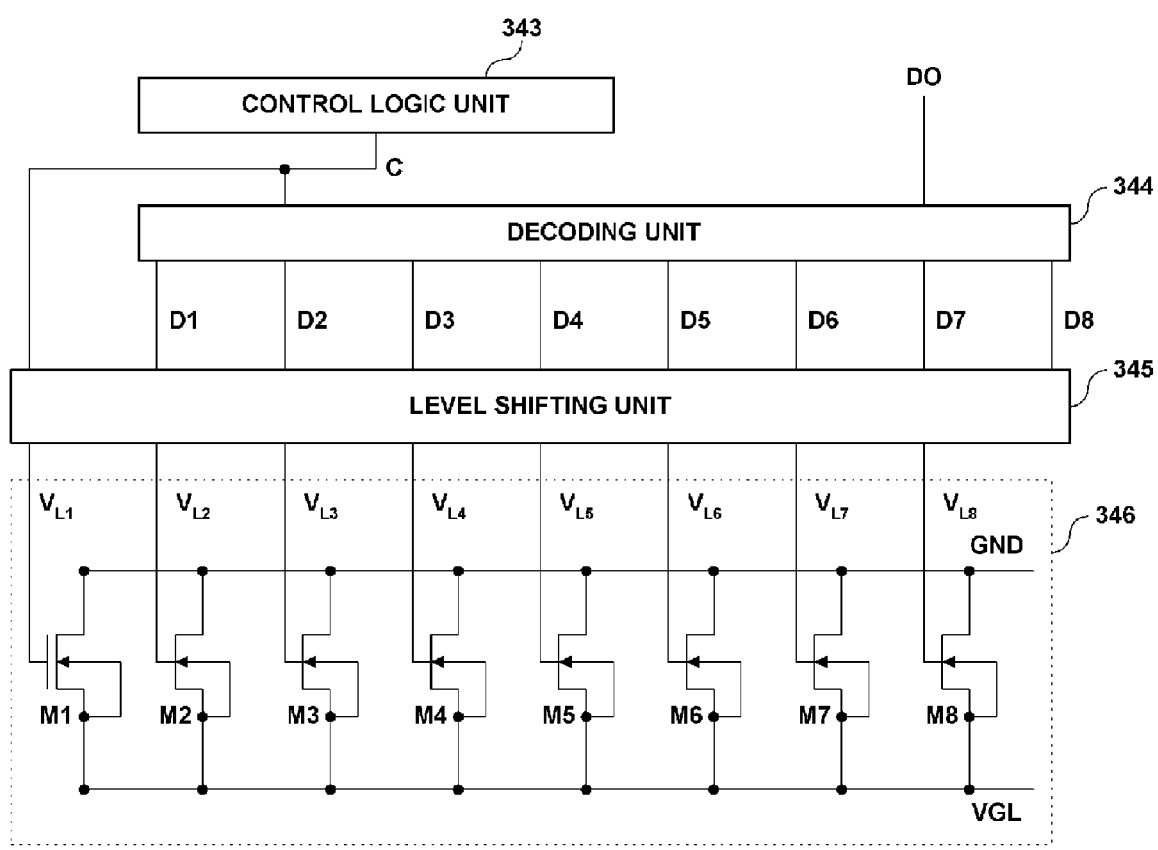
FIG. 8 is a block diagram illustrating an example of a second embodiment of the latch-up prevention unit of the display driving circuit.

FIG. 8 is a block diagram illustrating an example of a second embodiment of the latch-up prevention unit of the display driving circuit according to the present invention.

As shown in FIG. 8, the latch-up prevention unit 340 according to the second embodiment includes a control logic unit 343, a decoding unit 344, a level shifting unit 345, and a switching unit 346.

In this case, the control logic unit 343 is connected both to the decoding unit 344 and to the level shifting unit 345, and is configured to generate a control signal C, required to control the supply of a second driving voltage VGL, which is the lower of the first and second driving voltages VGH and VGL output from the second voltage generation unit 320 and is required to turn off the display panel, and to transmit the control signal C to the decoding unit 344 and the level shifting unit 345.

The decoding unit 344 is connected to the control logic unit 343 and the level shifting unit 345, and is configured to receive the control signal C from the control logic unit 343, receive a coding signal D0, preset by a user, and output a plurality of selection signals D1 to D8. At this time, the decoding unit 344 does not output the plurality of selection signals D1 to D8 when the control signal C, output from the control logic unit 343, is a signal required to turn off the switching unit 346. Further, the decoding signal D0 is a signal required for the selection of a plurality of switching means M1 to M8 provided in the switching unit 346, and is preset and input by the user.

Further, the level shifting unit 345 is connected to the control logic unit 343, the decoding unit 344 and the switching unit 346, and is configured to receive the control signal C, output from the control logic unit 343, to generate a plurality of gate voltages VL1 to VL8 corresponding to the control signal C and to output the gate voltages VL1 to VL8. At this time, only gate voltages VL1 to VL8 corresponding to the selection signals D1 to D8, output from the decoding unit 345, are output as voltages corresponding to the control signal C.

Meanwhile, when the control signal, output from the control logic unit 343, is a signal required to turn off the switching unit 346, the level shifting unit 345 outputs gate voltages VL1 to VL8 required to turn off the switching unit 346.

Furthermore, the switching unit 346 includes a plurality of switching means M1 to M8, is connected to the level shifting unit 345 and the second output terminal N2 of the second voltage generation unit 320, and is configured to receive the gate voltages VL1 to VL8 and to ground the second driving voltage VGL.

Here, the gates of respective switching means M1 to M8 are connected to the level shifting unit 345, the sources thereof are connected to the second output terminal N2 of the second voltage generation unit 320, and the drains thereof are connected to the ground. The switching means M1 to M8 connected in this way are turned on/off in response to the first to eighth gate voltages VL1 to VL8, and thus ground the second driving voltage VGL. Meanwhile, each of the first to eighth switching means M1 to M8 may be implemented using one selected from among an NMOS transistor and a PMOS transistor, and the connection thereof may also be varied.

The operation of the latch-up prevention unit 340 according to the second embodiment is described below. For example, at the time point at which the generation of the first and second source voltages VCH and VCL by the first and third voltage generation units 310 and 330 is not completed, that is, at which the generation of the second driving voltage VGL must be prevented, the control logic unit 341 outputs a control signal C, required to ground the second driving voltage VGL, which is generated by both the transistor of the first voltage generation unit 310 and the through current of the second voltage generation unit 320.

When the control signal C, required to ground the second driving voltage VGL, is output, both the decoding unit 344 and the level shifting unit 345 receive the control signal C, and the decoding unit 344 outputs selection signals D1 to D8 corresponding to the decoding signal D0 preset by the user.

When, of the switching means M1 to M8 of the switching unit 346, only four switching means M1 to M4 are designated to be used, the decoding unit 344 outputs selection signals D1 to D8 corresponding to '11110000' in response to the decoding signal D0. Further, when six switching means M1 to M6 are designated to be used, the decoding unit 344 outputs selection signals D1 to D8 corresponding to '11111100'.

When the selection signals D0 to D8 are output, the level shifting unit 345 receives the selection signals, and outputs gate voltages VL1 to VL8 corresponding to the selection signals D0 to D8. When the applied selection signals D0 to D8 are '11110000', the level shifting unit 345 outputs the first to fourth gate voltages VL1 to VL4 as high-level voltages, and the fifth to eighth gate voltages VL5 to VL8 as low-level voltages, and transmits the gate voltages to the switching unit 346.

The switching unit 346, having received the first to eighth gate voltages VL1 to VL8, is turned on or off in response to the first to eighth gate voltages VL1 to VL8, and thus grounds the second driving voltage VGL. When the first to fourth gate voltages VL1 to VL4 are high-level voltages and the fifth to eighth gate voltages VL5 to VL8 are low-level voltages, the first to fourth switching means M1 to M4 are turned on to ground the second driving voltage, and the fifth to eighth switching means M5 to M8 are turned off.

When the time point, at which the generation of the first and second source voltages VCH and VCL by the first and third voltage generation units 310 and 330 is completed and the second driving voltage VGL must be generated, is reached, the control logic unit 341 outputs the control signal C, required to supply the second driving voltage VGL, generated by the second voltage generation unit 320, to the display panel, without grounding the second driving voltage VGL.

In this case, in response to the control signal C, the decoding unit 344 and the level shifting unit 345 are not operated, or, alternatively, the level shifting unit 345 outputs gate voltages VL1 to VL8 having low levels corresponding to '00000000', so that all of the switching means M1 to M8 are turned off, and thus the second driving voltage VGL is supplied to the display panel without being grounded.

Therefore, through the above operation, the latch-up prevention unit 340 according to the second embodiment may serve to prevent an occurrence of latch-up by grounding the second driving voltage VGL and subsequently allowing the second driving voltage VGL to be smoothly supplied to the display panel when the second driving voltage VGL is generated before the time point at which it must be generated, thus preventing damage to the display driving circuit.

Since the latch-up prevention unit 340 can be manufactured on the same substrate at the time of manufacturing the first to third voltage generation units 310, 320 and 330, the size of the circuit may be reduced compared to a driving circuit in which a Schottky diode must be separately manufactured and attached in order to prevent the occurrence of latch-up. The connection between the driving circuit and the display panel through a flexible printed circuit board may be facilitated thanks to a spatial margin. Manufacturing processes may be simplified and the cost of materials may be reduced, thus improving production efficiency.

As described above, the second driving voltage, output from the second voltage generation unit, is connected to a latch-up prevention unit having a plurality of switching means connected to the ground, and is grounded for a preset period of time, so that the occurrence of latch-up may be prevented, thus improving the reliability of the display driving circuit.

Further, at the time of manufacturing the display driving circuit, the latch-up prevention unit may be manufactured together with the display driving circuit, so that the connection between the display driving circuit and the display panel may be facilitated, and the size of the driving circuit may be reduced. In addition, processes for manufacturing the display driving circuit may be simplified, and the cost of materials may be reduced.

A number of examples have been described above. Nevertheless, it will be understood that various modifications, additions and substitutions are possible. Accordingly, other implementations are within the scope of the following claims.

What is claimed is:

1. A display driving circuit, comprising:
    a first voltage generation unit, a second voltage generation unit, and a third voltage generation unit, the voltage generation units being connected to each other and configured to:
        receive an externally applied input voltage having a same magnitude; and
        generate respective voltages having different magnitudes, the second voltage generation unit being configured to:
            receive source voltages generated by the first and third voltage generation units; and
            output a high driving voltage and a low driving voltage; and
    a latch-up prevention unit connected to the second voltage generation unit, the latch-up prevention unit comprising a control logic unit configured to output a control signal that is used to control a supply of the low driving voltage, the latch-up prevention unit being configured to:
        receive the low driving voltage from the second voltage generation unit; and
        ground the low driving voltage for a preset period of time,
    wherein the control signal is output by the control logic unit when the second voltage generation unit has not received the source voltages generated by the first and third voltage generation units, thereby grounding the low driving voltage for the preset period of time.

2. The display driving circuit according to claim 1, wherein the latch-up prevention unit further comprises:
    a level shifting unit connected to the control logic unit, the level shifting unit being configured to:
        receive the control signal from the control logic unit; and
        output a gate voltage corresponding to the control signal; and
    a switching means, comprising:
        a gate connected to the level shifting unit;
        a source connected to the second voltage generation unit; and
        a drain that is grounded.

3. The display driving circuit according to claim 2, wherein the source of the switching means is connected to an output terminal through which the low driving voltage is output.

4. The display driving circuit according to claim 3, wherein the switching means is one selected from among an NMOS transistor and a PMOS transistor.

5. The display driving circuit according to claim 2, wherein the gate voltage is output by the level shifting unit to ground the low driving voltage for the preset period of time when the control signal is received by the level shifting unit.

6. The display driving circuit according to claim 5, wherein the switching means grounds the low driving voltage for the preset period of time when the switching means receives the gate voltage outputted from the level shifting unit.

7. The display driving circuit according to claim 1, wherein the latch-up prevention unit further comprises:
    a decoding unit connected to the control logic unit, the decoding unit being configured to:
        receive the control signal and a decoding signal preset by a user; and
        output a plurality of selection signals;
    a level shifting unit connected to the control logic unit and the decoding unit, the level shifting unit being configured to:
        receive the control signal from the control logic unit and the plurality of selection signals from the decoding unit; and
        output a plurality of gate voltages; and
    a switching unit connected to the level shifting unit, the switching unit being configured to:
        receive the plurality of gate voltages; and
        ground the low driving voltage.

8. The display driving circuit according to claim 7, wherein the switching unit comprises a plurality of switching means, each of the switching means comprising:
    a gate connected to the level shifting unit;
    a source connected to the second voltage generation unit; and
    a drain which is grounded.

9. The display driving circuit according to claim 8, wherein the source of each of the switching means is connected to an output terminal through which the low driving voltage is output.

10. The display driving circuit according to claim 9, wherein each of the switching means is one selected from among an NMOS transistor and a PMOS transistor.

11. The display driving circuit according to claim 7, wherein, to ground the low driving voltage for the preset period of time, the plurality of gate voltages is output by the level shifting unit in response to the plurality of selection signals received from the decoding unit when the control signal is received by the level shifting unit and the decoding unit.

12. The display driving circuit according to claim 11, wherein the switching unit grounds the low driving voltage for the preset period of time when the switching unit receives the plurality of gate voltages outputted from the level shifting unit.

13. The display driving circuit according to claim 1, wherein the low driving voltage is generated by an output of a transistor of the first voltage generation unit and a through current of the second voltage generation unit.

14. The display driving circuit according to claim 1, wherein the low driving voltage is grounded for the preset period of time when the second voltage generation unit has not received the source voltages generated by the first and third voltage generation units.

15. A display driving circuit, comprising:
    a first voltage generation unit, a second voltage generation unit, and a third voltage generation unit, the voltage generation units being connected to each other and configured to:
        receive an externally applied input voltage having a same magnitude; and
        generate respective voltages having different magnitudes, the second voltage generation unit being configured to:
            receive source voltages generated by the first and third voltage generation units; and
            output a high driving voltage and a low driving voltage; and
    a latch-up prevention unit connected to the second voltage generation unit, the latch-up prevention unit comprising a control logic unit configured to output a control signal that is used to control a supply of the low driving voltage, the latch-up prevention unit being configured to:
- receive the low driving voltage from the second voltage generation unit; and
- ground the low driving voltage for a preset period of time, wherein the control logic unit outputs the control signal to thereby ground the low driving voltage for the preset period of time if the first and third generation voltage units fail to generate the source voltages.

16. The display driving circuit according to claim 15, wherein the latch-up prevention unit further comprises:
- a level shifting unit connected to the control logic unit, the level shifting unit being configured to:
  - receive the control signal from the control logic unit; and
  - output a gate voltage corresponding to the control signal; and
- a switching means, comprising:
  - a gate connected to the level shifting unit;
  - a source connected to the second voltage generation unit; and
  - a drain that is grounded.

17. The display driving circuit according to claim 16, wherein:
- the gate voltage is output by the level shifting unit to ground the low driving voltage for the preset period of time when the control signal is received by the level shifting unit; and
- the switching means grounds the low driving voltage for the preset period of time when the switching means receives the gate voltage outputted from the level shifting unit.

18. The display driving circuit according to claim 15, the latch-up prevention unit further comprises:
- a decoding unit connected to the control logic unit, the decoding unit being configured to:
  - receive the control signal and a decoding signal preset by a user; and
  - output a plurality of selection signals;
- a level shifting unit connected to the control logic unit and the decoding unit, the level shifting unit being configured to:
  - receive the control signal from the control logic unit and the plurality of selection signals from the decoding unit; and
  - output a plurality of gate voltages; and
- a switching unit connected to the level shifting unit, the switching unit being configured to:
  - receive the plurality of gate voltages; and
  - ground the low driving voltage.

19. The display driving circuit according to claim 18, wherein:
- to ground the low driving voltage for the preset period of time, the plurality of gate voltages is output by the level shifting unit in response to the plurality of selection signals received from the decoding unit when the control signal is received by the level shifting unit and the decoding unit; and
- the switching unit grounds the low driving voltage for the preset period of time when the switching unit receives the plurality of gate voltages outputted from the level shifting unit.

* * * * *